United States Patent
Chien et al.

(10) Patent No.: US 10,418,352 B1
(45) Date of Patent: Sep. 17, 2019

(54) MOBILE COMMUNICATION DEVICE AND OPTICAL PACKAGE STRUCTURE THEREOF

(71) Applicant: ANPEC ELECTRONICS CORPORATION, Hsinchu (TW)

(72) Inventors: Chih-Cheng Chien, New Taipei (TW); Chien-Chung Hsiao, Taoyuan (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/294,993

(22) Filed: Mar. 7, 2019

(30) Foreign Application Priority Data

Jan. 10, 2019 (TW) .............................. 108101029 A

(51) Int. Cl.
*H04W 4/80* (2018.01)
*H01L 25/16* (2006.01)
*H04M 1/02* (2006.01)

(52) U.S. Cl.
CPC .......... *H01L 25/167* (2013.01); *H01L 25/165* (2013.01); *H04M 1/0266* (2013.01); *H04M 1/0277* (2013.01)

(58) Field of Classification Search
CPC ........... G06F 2203/04808; G06F 3/042; G06F 3/0421; G06F 3/04883; G06F 1/1616; G06F 1/1643; G06F 1/169; G06F 2203/04104; G06F 2203/04806; G06F 3/0412; G06F 3/0425; G06F 3/0428; G06F 2203/04108; G06F 3/044; H01L 51/0096; H01L 51/5203; H01L 2224/48111; H01L 25/0753; H01H 13/83; H01H 2205/004; H01H 2219/046; H01H 2221/07; H01H 3/125; H05K 1/16; H05K 2201/10106; H05K 1/0274; H05K 2201/10098; H05K 2201/10121; H05K 2201/10151; H01S 5/02236; H01S 5/02248

See application file for complete search history.

(56) References Cited

U.S. PATENT DOCUMENTS

| | | | |
|---|---|---|---|
| 2014/0257049 A1* | 9/2014 | Soundarapandian | A61B 5/681 600/301 |
| 2015/0373846 A1* | 12/2015 | Kawasaki | H01L 23/13 361/767 |
| 2017/0148771 A1* | 5/2017 | Cha | H01L 25/0753 |

* cited by examiner

*Primary Examiner* — Quan M Hua
(74) *Attorney, Agent, or Firm* — Li & Cai Intellectual Property (USA) Office

(57) ABSTRACT

An optical package structure of a mobile communication device includes a board, electrodes formed on the board, a light emitter and an IC chip both disposed on the board, and a light permeable package body encapsulating the light emitter and the IC chip. The electrodes are respectively arranged on a lower edge portion and two lateral edge portions of the board, and the number of the electrodes on the lower edge portion is larger than that on any of the two lateral edge portions. The light emitter is electrically coupled to at least one of the electrodes. The IC chip includes a light sensor corresponding in position to the light emitter and connecting pads electrically coupled to the electrodes. A distance from the light sensor to the upper edge portion is less than that to the lower edge portion, and is equal to or less than 250 μm.

10 Claims, 6 Drawing Sheets

MOBILE COMMUNICATION DEVICE AND OPTICAL PACKAGE STRUCTURE THEREOF

CROSS-REFERENCE TO RELATED PATENT APPLICATION

This application claims the benefit of priority to Taiwan Patent Application No. 108101029, filed on Jan. 10, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a mobile communication device and an optical package structure thereof.

BACKGROUND OF THE DISCLOSURE

A conventional mobile communication device (e.g., a mobile phone) includes a housing and a display screen fastened to the housing. The display screen is now occupying a higher and higher surface area on a front surface of the conventional mobile communication device, and the housing is now occupying a lower and lower surface area in the front surface of the conventional mobile communication device, so that an optical package structure in the conventional mobile communication device is difficult to be arranged at a position corresponding to the housing. For example, in the conventional mobile communication device that has the display screen occupying at least 80% of the front surface, the display screen needs to be formed with a hole in a corner thereof for facilitating the arrangement of the optical package structure. Accordingly, one of the topics in the related art is how to improve on the arrangement of the conventional optical package structure at a position corresponding to the housing.

SUMMARY OF THE DISCLOSURE

In response to the above-referenced technical inadequacies, the present disclosure provides a mobile communication device and an optical package structure thereof which effectively improve the conventional optical package structures.

In one aspect, the present disclosure provides a mobile communication device, which includes a device assembly, an optical package structure, and a plurality of soldering bodies. The device assembly includes a housing, a display screen fastened to the housing, and a circuit board arranged in the housing and electrically coupled to the display screen. The display screen occupies at least 80% of a front surface of the device assembly, and the housing includes a surrounding portion disposed around the display screen. The surrounding portion has at least one light permeable part arranged on the front surface of the housing. The optical package structure is fixed on the circuit board and is arranged in the housing. The optical package structure includes a board, a plurality of electrodes, a light emitter, an integrated circuit (IC) chip, and a light permeable package body. The board includes an upper edge portion, a lower edge portion opposite to the upper edge portion, and two lateral edge portions opposite to each other. The electrodes are formed on the board and are respectively arranged on the lower edge portion and the two lateral edge portions. The number of the electrodes on the lower edge portion is larger than the number of the electrodes on any of the two lateral edge portions. The light emitter is disposed on the board and is electrically coupled to at least one of the electrodes. The IC chip is disposed on the board and includes a light sensor and a plurality of connecting pads. The light sensor corresponds in position to the light emitter, and the connecting pads are respectively and electrically coupled to the electrodes in a wire bonding manner. A first distance between the light sensor and the upper edge portion is less than a second distance between the light sensor and the lower edge portion, and is equal to or less than 250 μm. The light permeable package body is formed on the board. The light emitter and the IC chip are embedded in the light permeable package body. The soldering bodies respectively connect the electrodes of the optical package structure to the circuit board so as to electrically couple the light emitter and the IC chip to the circuit board. The upper edge portion of the board and an edge of the circuit board adjacent to the upper edge portion have a minimum distance therebetween that is less than 1 mm. The light emitter and the light sensor of the optical package structure are aligned with the at least one light permeable part of the housing along a normal vector of the front surface.

In one aspect, the present disclosure provides an optical package structure of a mobile communication device, which includes a board, a plurality of electrodes, an integrated circuit (IC) chip, and a light permeable package body. The board includes an upper edge portion, a lower edge portion opposite to the upper edge portion, and two lateral edge portions opposite to each other. The electrodes are formed on the board and are respectively arranged on the lower edge portion and the two lateral edge portions. The number of the electrodes on the lower edge portion is larger than the number of the electrodes on any of the two lateral edge portions. The light emitter is disposed on the board and is electrically coupled to at least one of the electrodes. The IC chip is disposed on the board and includes a light sensor and a plurality of connecting pads. The light sensor corresponds in position to the light emitter, and the connecting pads are respectively and electrically coupled to the electrodes in a wire bonding manner. A first distance between the light sensor and the upper edge portion is less than a second distance between the light sensor and the lower edge portion, and is equal to or less than 250 μm. The light permeable package body is formed on the board. The light emitter and the IC chip are embedded in the light permeable package body.

Therefore, when the display screen occupies at least 80% of the front surface of the mobile communication device, the optical package structure of the mobile communication device in the present disclosure can be arranged at a position corresponding to the housing (e.g., the upper segment) by the structural design of the optical package structure (e.g., a distance between the light sensor and the upper edge portion is reduced to be equal to or less than 250 μm) and/or the cooperation of the optical package structure and the device assembly (e.g., a distance between the upper edge portion of the board and the adjacent edge of the circuit board is reduced to be less than 1 mm).

Specifically, since the electrodes of the optical package structure are respectively arranged on the lower edge portion and the two lateral edge portions of the board, the density of the electrodes of any of the two lateral edge portions in the present disclosure is less than that of any lateral edge portion of the conventional optical package structure. Accordingly, in the present disclosure, the size of the optical package structure can be reduced, and the production yield of the optical package structure can be effectively improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
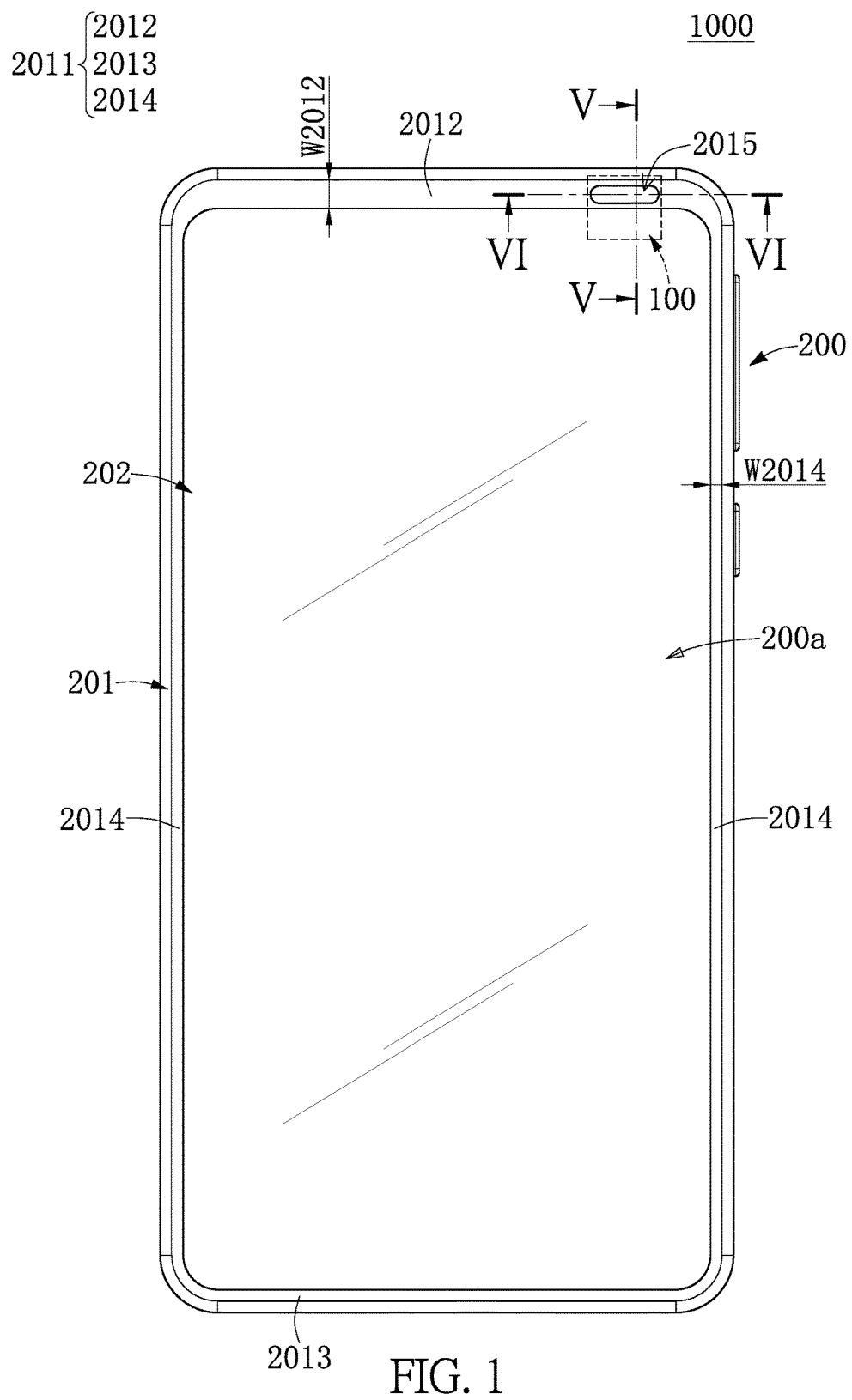
FIG. 1 is a front view of a mobile communication device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
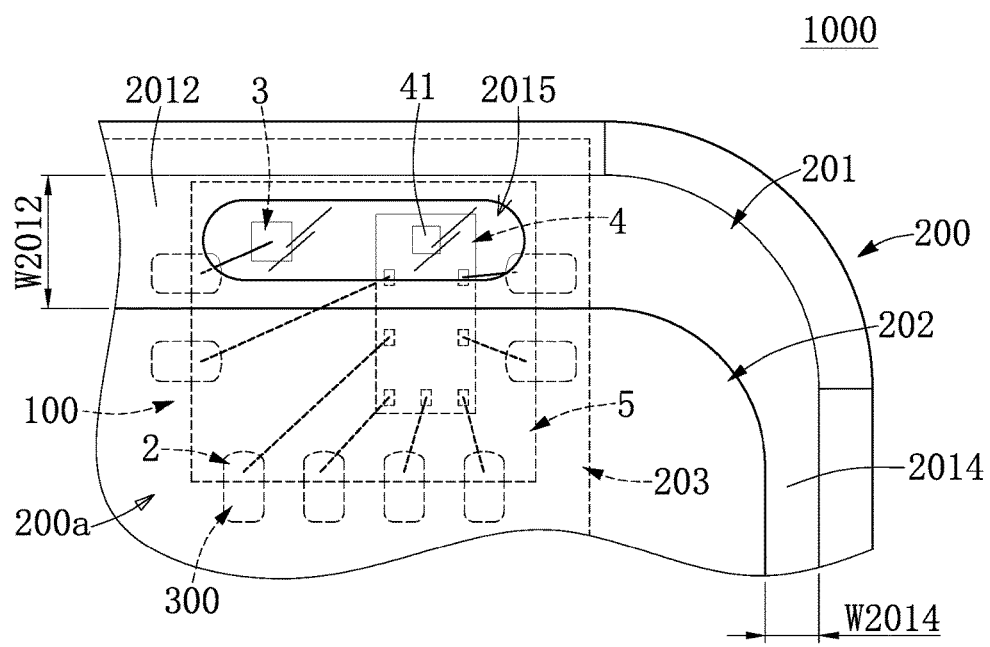
FIG. 2 is an enlarged view of FIG. 1.
Figure 3:
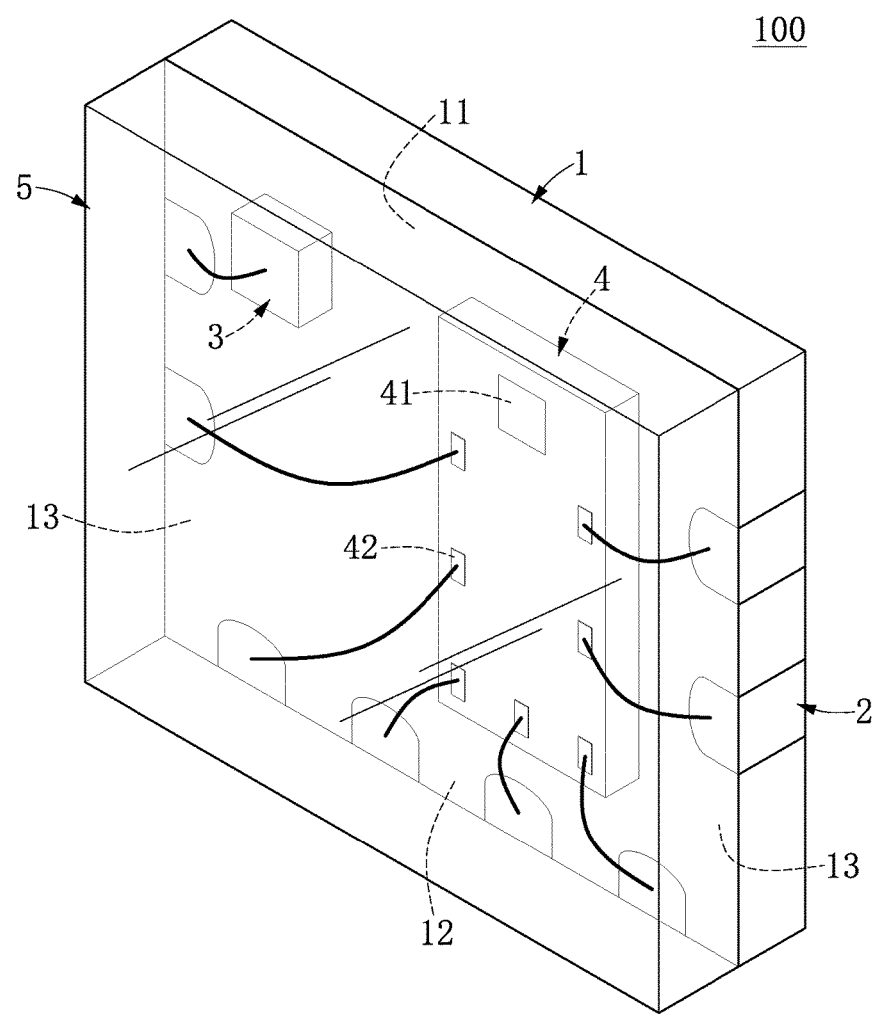
FIG. 3 is a perspective view of an optical package structure of FIG. 1 according to the first embodiment of the present disclosure.
Figure 4:
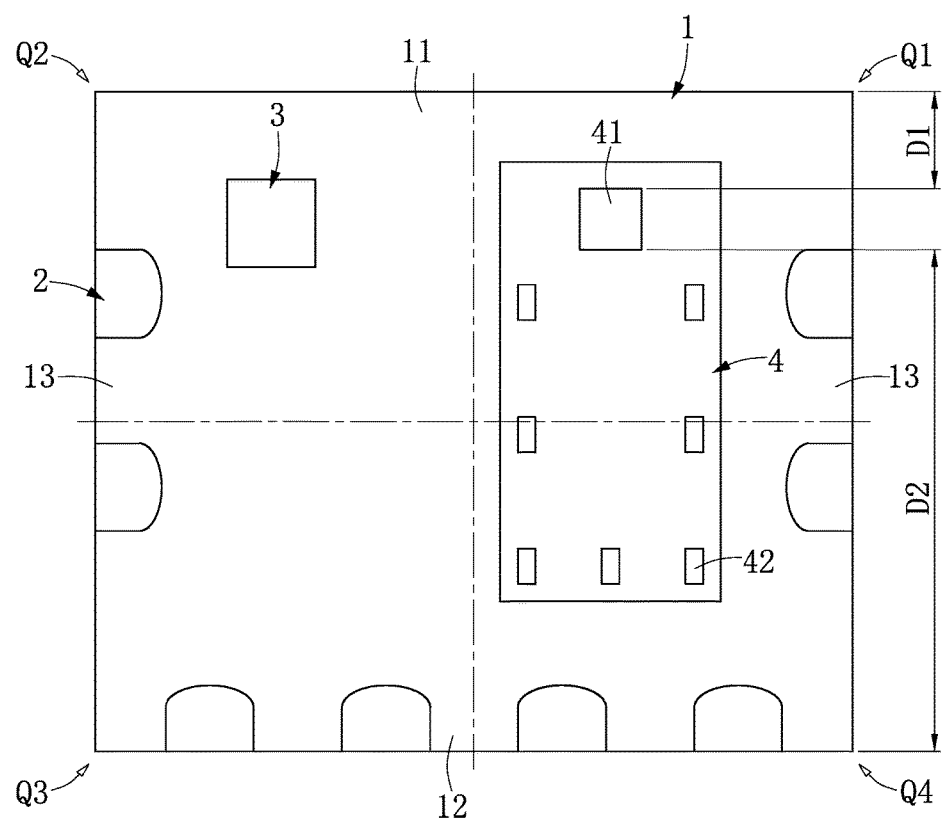
FIG. 4 is a front view of the optical package structure with a light permeable part and metal wires omitted.
Figure 5:
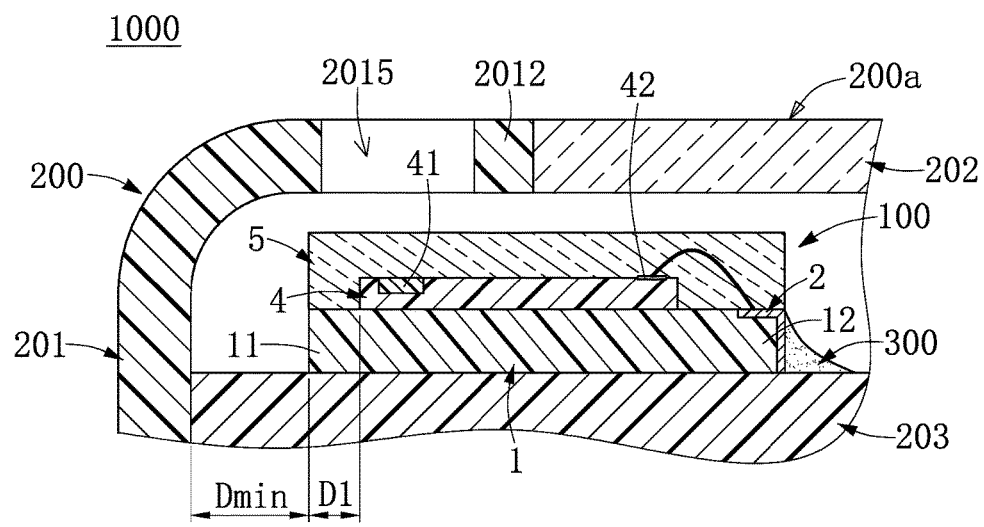
FIG. 5 is a cross-sectional view taken along line V-V of FIG. 1.

Referring to FIG. 1 to FIG. 6, a first embodiment of the present disclosure provides a mobile communication device 1000. As shown in FIG. 1 and FIG. 2, the mobile communication device 1000 in the present embodiment is a mobile phone, but the present disclosure is not limited thereto. The mobile communication device 1000 includes a device assembly 200, an optical package structure 100 installed in the device assembly 200, and a plurality of soldering bodies 300 (as shown in FIG. 5) electrically coupling the assembly 200 and the optical package structure 100. It should be noted that, the optical package structure 100 in the present embodiment is described together with the device assembly 200 and the soldering bodies 300, but the optical package structure 100 in other embodiments of the present disclosure can be used independently or in cooperation with other components.

As shown in FIG. 1 and FIG. 2, the device assembly 200 includes a housing 201, a display screen 202 fastened to the housing 201, and a circuit board 203 (as shown in FIG. 5) arranged in the housing 201 and electrically coupled to the display screen 202. The display screen 202 in the present disclosure occupies at least 80% of a front surface 200a of the device assembly 200, and the display screen 202 is preferably in a rectangular shape. On the other hand, the device assembly 200 is formed to match with the optical package structure 100 of the present embodiment, so that when the display screen 202 occupies at least 80% of the front surface 200a of the device assembly 200, the display screen 202 can still be formed in a rectangular shape.

It should be noted that the display screen 202 in the present embodiment preferably refers to an area of the front surface 200a of the device assembly 200 used for displaying, and the other area of the front surface 200a not used for displaying can be referred to as a part of the housing 201.

Moreover, the housing 201 includes a surrounding portion 2011 disposed around the display screen 202. Specifically, an area of the surrounding portion 2011 belonging to the front surface 200a includes an upper segment 2012, a lower segment 2013, and two lateral segments 2014, which are arranged around the display screen 202. The upper segment 2012, the lower segment 2013, and the two lateral segments 2014 in the present embodiment are jointly formed in a rectangular ring shape. The upper segment 2012 has the same width W2012 that is preferably equal to or larger than two times of a width W2014 of any of the two lateral segments 2014, but the present disclosure is not limited thereto. Accordingly, a portion of a housing not having the same width is different from the upper segment 2012 of the housing 201 of the present embodiment.

Specifically, the surrounding portion 2011 has at least one light permeable part 2015 arranged on the front surface 200a of the housing 200. The at least one light permeable part 2015 in the present embodiment is formed in the upper segment 2012 of the surrounding portion 2011. The number of the at least one light permeable part 2015 is preferably one or two, and the at least one light permeable part 2015 can be a hole or made of a light permeable material.

Moreover, the shape of the at least one light permeable part 2015 can be changed according to design requirements (e.g., to have a round shape).

As shown in FIG. 1 and FIG. 5, the optical package structure 100 is fixed on the circuit board 203 and is arranged in the housing 201. As shown in FIG. 3 and FIG. 4, the optical package structure 100 includes a board 1, a plurality of electrodes 2 formed on the board 1, a light emitter 3 and an integrated circuit (IC) chip 4 both disposed on the board 1, and a light permeable package body 5 formed on the board 1.

The board 1 in the present embodiment is rectangular and flat. The board 1 includes an upper edge portion 11, a lower edge portion 12 opposite to the upper edge portion 11, and two lateral edge portions 13 opposite to each other. A length of the upper edge portion 11 is preferably larger than that of any of the two lateral edge portions 13. The electrodes 2 are respectively arranged on the lower edge portion 12 and the two lateral edge portions 13, and the number of the electrodes 2 on the lower edge portion 12 is larger than the number of the electrodes 2 on any of the two lateral edge portions 13.

It should be noted that, the board 1 and the electrodes 2 formed on the board 1 can be a printed circuit board or a lead frame, or the board 1 can be a ceramic board or a multi-layer board. Moreover, the number of the electrodes 2 of the optical package structure 100 in the present embodiment is eight. Specifically, in the present embodiment, the lower edge portion 12 is formed with four of the electrodes 2, each of the two lateral edge portions 13 is formed with two of the electrodes 2, and each of the electrodes 2 is formed on a board surface and one of lateral surfaces of the board 1.

In addition, the board 1 in the present embodiment is limited to having the upper edge portion 11 formed without any electrodes 2. In other words, a board with an electrode arranged on an upper edge portion thereof would be different from the board 1 of the present embodiment. On the other hand, the board 1 in the present embodiment is limited to having the lower edge portion 12 and the two lateral edge portions 13, which are respectively formed with the electrodes 2. In other words, a board with electrodes arranged only on two lateral edge portions thereof would be different from the board 1 of the present embodiment.

As shown in FIG. 3 and FIG. 4, the IC chip 4 is in an elongated shape, and a longitudinal direction of the IC chip 4 is parallel to any one of the two lateral edge portions 13 (or is perpendicular to the upper edge portion 11 of the board 1). The IC chip 4 includes a light sensor 41 and a plurality of connecting pads 42. The light sensor 41 is located at a position in the IC chip 4 that is adjacent to the upper edge portion 11 of the board 1, and the connecting pads 42 are distributed on a periphery portion of the IC chip 4.

Specifically, the light emitter 3 and the light sensor 41 are disposed on the same board surface of the board 1, and the light sensor 41 corresponds in position to the light emitter 3 (e.g., the light emitter 3 and the light sensor 41 are in an arrangement direction that is parallel to the upper edge portion 11). Since the upper edge portion 11 is formed without any electrodes 2, a first distance D1 between the light sensor 41 and the upper edge portion 11 can be less than a second distance D2 between the light sensor 41 and the lower edge portion 12, and is equal to or less than 250 μm.

On the other hand, if the board 1 is divided into four quadrants Q1-Q4 according to a center point thereof, the light emitter 3 and the light sensor 41 would respectively be located at two of the four quadrants Q1-Q4 that include the upper edge portion 11 (i.e., the two quadrants Q1, Q2).

Specifically, the second distance D2 is at least two times of the first distance D1, and distance between the light sensor 41 and one of the two lateral edge portions 13 (e.g., the left lateral edge portion 13 shown in FIG. 4) is at least two times of a distance between the light sensor 41 and the other lateral edge portion 13 (e.g., the right lateral edge portion 13 shown in FIG. 4). Moreover, a distance between the light emitter 3 and the lower edge portion 12 is at least two times of a distance between the light emitter 3 and the upper edge portion 11, and a distance between the light emitter 3 and one of the two lateral edge portions 13 (e.g., the right lateral edge portion 13 shown in FIG. 4) is at least two times of a distance between the light emitter 3 and the other lateral edge portion 13 (e.g., the left lateral edge portion 13 shown in FIG. 4).

Accordingly, the light emitter 3 and the light sensor 41 in the present embodiment are in an eccentric arrangement with respect to the board 1. In other words, an optical package structure having a light sensor not arranged in an eccentric arrangement is different from the optical package structure 100 of the present embodiment.

The light emitter 3 is electrically coupled to at least one of the electrodes 2, and the connecting pads 42 of the IC chip 4 are respectively and electrically coupled to the electrodes 2 in a wire bonding manner. The light sensor 41 is electrically coupled to at least one of the electrodes 2 through the corresponding connecting pad 42.

As shown in FIG. 3, the light permeable package body 5 is integrally formed on the board 1, and the light emitter 3 and the IC chip 4 are embedded in the light permeable package body 5. The light permeable package body 5 is substantially a cuboid and covers one of the board surfaces of the board 1, and lateral surfaces of the light permeable package body 5 are respectively flush with the lateral surfaces of the board 1. Moreover, metal wires (not labeled) connected to the light emitter 3 and the IC chip 4 and a portion of each of the electrodes 2 connected to the corresponding metal wire are embedded in the light permeable package body 5, but the other portion of each of the electrodes 2 formed on the corresponding lateral surface of the board 1 is not covered by the light permeable package body 5.

Figure 6:
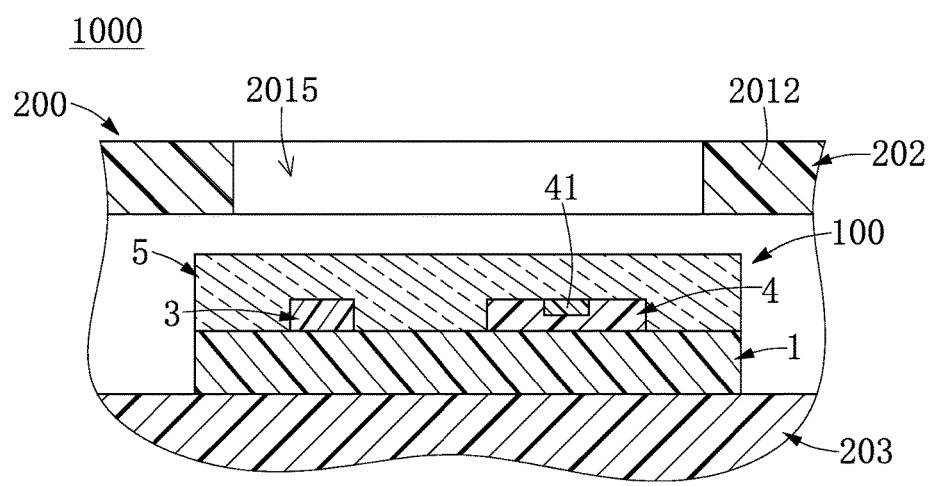
FIG. 6 is a cross-sectional view taken along line VI-VI of FIG. 1.

As shown in FIG. 5 and FIG. 6, the soldering bodies 300 respectively connect the electrodes 2 of the optical package structure 100 to the circuit board 203 of the device assembly 200 so as to electrically couple the light emitter 3 and the IC chip 4 to the circuit board 203. Since the upper edge portion 11 is formed without any electrodes 2, the upper edge portion 11 does not connect with any soldering bodies 300. Accordingly, the upper edge portion 11 of the board 1 and an edge of the circuit board 203 adjacent to the upper edge portion 11 have a minimum distance Dmin therebetween that is less than 1 mm.

As shown in FIG. 5 and FIG. 6, in the connection relationship between the optical package structure 100 and the device assembly 200, the light emitter 3 and the light sensor 41 of the optical package structure 100 are aligned with the at least one light permeable part 2015 of the housing 201 along a normal vector of the front surface 200a of the device assembly 200, so that the light emitter 3 and the light sensor 41 can emit and receive light through the at least one light permeable part 2015 of the housing 201. Moreover, a projected space defined by orthogonally projecting the display screen 202 onto the circuit board 203 covers a part of the optical package structure 100 (e.g., a right part of the optical package structure 100 shown in FIG. 5).

Second Embodiment

Figure 7:
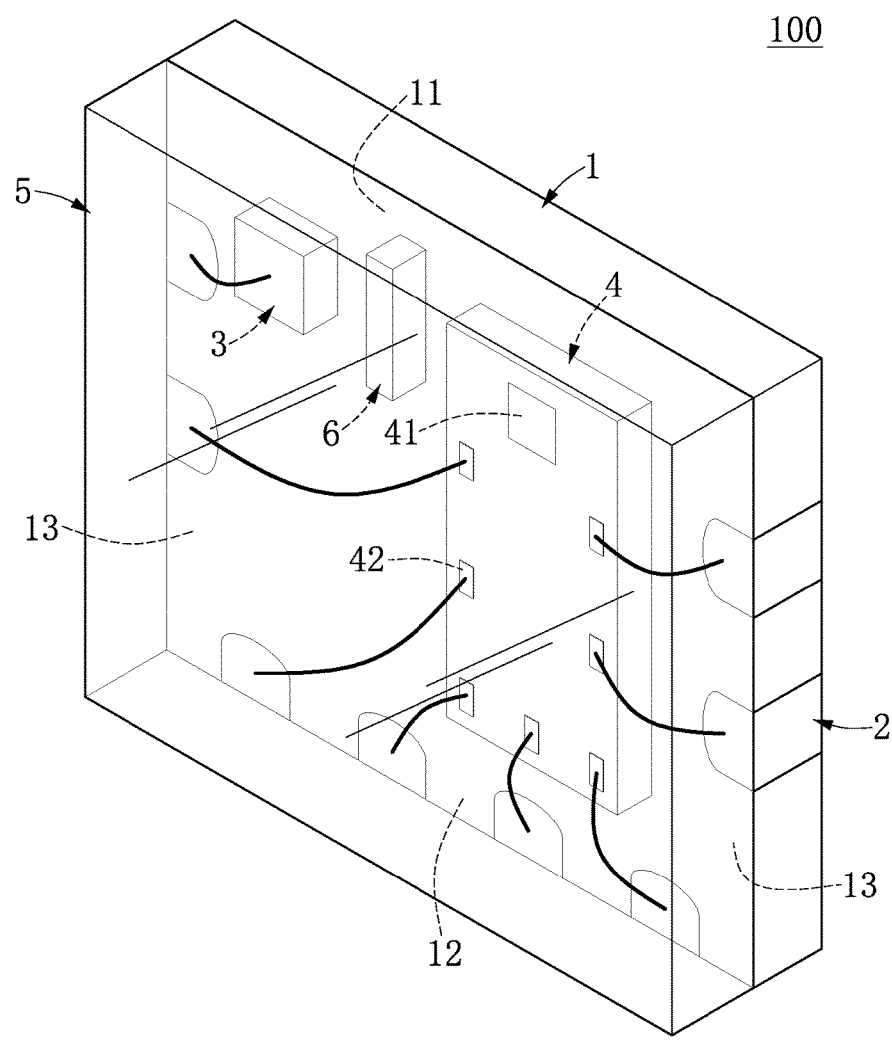
FIG. 7 is a perspective view of an optical package structure according to a second embodiment of the present disclosure.

Referring to FIG. 7, a second embodiment of the present disclosure provides an optical package structure 100. Some components of the optical package structure 100 in the present embodiment are similar to the corresponding components of the optical package structure 100 disclosed in the first embodiment, so that the following description discloses only the different features of the present embodiment for the sake of brevity.

In the present embodiment, the optical package structure 100 includes a wall 6 disposed on the board 1 and embedded in the light permeable package body 5, but the present disclosure is not limited thereto. Moreover, the wall 6 is disposed between the light emitter 3 and the light sensor 41, and a thickness of the wall 6 is preferably larger than that of the light emitter 3, thereby preventing the light emitter 3 and the light sensor 41 of the optical package structure 100 from interfering with each other.

In conclusion, when the display screen occupies at least 80% of the front surface of the mobile communication device, the optical package structure of the mobile communication device in the present disclosure can be arranged at a position corresponding to the housing (e.g., the upper segment) by the structural design of the optical package structure (e.g., a distance between the light sensor and the upper edge portion is reduced to be equal to or less than 250 μm) and/or the cooperation of the optical package structure and the device assembly (e.g., a distance between the upper edge portion of the board and the adjacent edge of the circuit board is reduced to be less than 1 mm).

Specifically, since the electrodes of the optical package structure are respectively arranged on the lower edge portion and the two lateral edge portions of the board, the density of the electrodes of any one of the two lateral edge portions in the present disclosure is less than that of any lateral edge portion of the conventional optical package structure. Accordingly, in the present disclosure, the size of the optical package structure can be reduced, and the production yield of the optical package structure can be effectively improved.

Moreover, since the light sensor (and the light emitter) in the present disclosure is in an eccentric arrangement with respect to the board, a distance between the light sensor and the upper edge portion of the board can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A mobile communication device, comprising:
    a device assembly including a housing, a display screen fastened to the housing, and a circuit board arranged in the housing and electrically coupled to the display screen, wherein the display screen occupies at least 80% of a front surface of the device assembly, and the housing includes a surrounding portion disposed around the display screen, and wherein the surrounding portion has at least one light permeable part arranged on the front surface of the housing;
    an optical package structure fixed on the circuit board and arranged in the housing, wherein the optical package structure includes:
        a board including an upper edge portion, a lower edge portion opposite to the upper edge portion, and two lateral edge portions opposite to each other;
        a plurality of electrodes formed on the board and respectively arranged on the lower edge portion and the two lateral edge portions, wherein the number of the electrodes on the lower edge portion is larger than the number of the electrodes on any of the two lateral edge portions;
        a light emitter disposed on the board and electrically coupled to at least one of the electrodes;
        an integrated circuit (IC) chip disposed on the board, wherein the IC chip includes a light sensor and a plurality of connecting pads, the light sensor corresponds in position to the light emitter, and the connecting pads are respectively and electrically coupled to the electrodes in a wire bonding manner, and wherein a first distance between the light sensor and the upper edge portion is less than a second distance between the light sensor and the lower edge portion, and is equal to or less than 250 μm; and
        a light permeable package body formed on the board, wherein the light emitter and the IC chip are embedded in the light permeable package body; and
    a plurality of soldering bodies that respectively connect the electrodes of the optical package structure to the circuit board so as to electrically couple the light emitter and the IC chip to the circuit board, wherein the upper edge portion of the board and an edge of the circuit board adjacent to the upper edge portion have a minimum distance therebetween that is less than 1 mm,
    wherein the light emitter and the light sensor of the optical package structure are aligned with the at least one light permeable part of the housing along a normal vector of the front surface.

2. The mobile communication device according to claim 1, wherein the light emitter and the light sensor are in an arrangement direction that is parallel to the upper edge portion, and wherein the upper edge portion is formed without any electrodes, and does not connect with any soldering bodies.

3. The mobile communication device according to claim 1, wherein the optical package structure includes a wall disposed on the board and between the light emitter and the light sensor.

4. The mobile communication device according to claim 1, wherein the IC chip is in an elongated shape, a longitudinal direction of the IC chip is parallel to any one of the two lateral edge portions, and a length of the upper edge portion is larger than that of any one of the two lateral edge portions.

5. The mobile communication device according to claim 1, wherein the board is divided into four quadrants according to a center point thereof, and the light emitter and the light sensor are respectively located at two of the four quadrants that include the upper edge portion.

6. The mobile communication device according to claim 5, wherein the second distance is at least two times of the first distance, a distance between the light sensor and one of the two lateral edge portions is at least two times of a distance between the light sensor and the other lateral edge portion, a distance between the light emitter and the lower edge portion is at least two times of a distance between the light emitter and the upper edge portion, and a distance between the light emitter and one of the two lateral edge portions is at least two times of a distance between the light emitter and the other lateral edge portion.

7. The mobile communication device according to claim 1, wherein the display screen is in a rectangular shape, and a projected space defined by orthogonally projecting the display screen onto the circuit board covers a part of the optical package structure, wherein an area of the surrounding portion belonging to the front surface includes an upper segment, a lower segment, and two lateral segments, which are arranged around the display screen, and wherein the upper segment has the same width, and the at least one light permeable part is formed in the upper segment.

8. An optical package structure of a mobile communication device, comprising:
- a board including an upper edge portion, a lower edge portion opposite to the upper edge portion, and two lateral edge portions opposite to each other;
- a plurality of electrodes formed on the board and respectively arranged on the lower edge portion and the two lateral edge portions, wherein the number of the electrodes on the lower edge portion is larger than the number of the electrodes on any of the two lateral edge portions;
- a light emitter disposed on the board and electrically coupled to at least one of the electrodes;
- an integrated circuit (IC) chip disposed on the board, wherein the IC chip includes a light sensor and a plurality of connecting pads, the light sensor corresponds in position to the light emitter, and the connecting pads are respectively and electrically coupled to the electrodes in a wire bonding manner, and wherein a first distance between the light sensor and the upper edge portion is less than a second distance between the light sensor and the lower edge portion, and is equal to or less than 250 µm; and
- a light permeable package body formed on the board, wherein the light emitter and the IC chip are embedded in the light permeable package body.

9. The optical package structure according to claim 8, wherein the light emitter and the light sensor are in an arrangement direction that is parallel to the upper edge portion, and wherein the IC chip is in an elongated shape, a longitudinal direction of the IC chip is parallel to any of the two lateral edge portions, and a length of the upper edge portion is larger than that of any of the two lateral edge portions.

10. The optical package structure according to claim 8, wherein the board is divided into four quadrants according to a center point thereof, and the light emitter and the light sensor are respectively located at two of the four quadrants that include the upper edge portion, and wherein the second distance is at least two times of the first distance, a distance between the light sensor and one of the two lateral edge portions is at least two times of a distance between the light sensor and the other lateral edge portion, a distance between the light emitter and the lower edge portion is at least two times of a distance between the light emitter and the upper edge portion, and a distance between the light emitter and one of the two lateral edge portions is at least two times of a distance between the light emitter and the other lateral edge portion.

* * * * *